United States Patent [19]

Denny

[11] 4,286,234

[45] Aug. 25, 1981

[54] MULTIVIBRATOR CIRCUIT

[75] Inventor: Richard W. Denny, Littleton, Colo.

[73] Assignee: Honeywell Inc., Minneapolis, Minn.

[21] Appl. No.: 12,056

[22] Filed: Feb. 13, 1979

[51] Int. Cl.³ .......................................... H03K 3/282
[52] U.S. Cl. ................................ 331/113 R; 307/271;
331/177 R
[58] Field of Search ............................. 307/271, 289;
331/113 R, 145, 185, 177 R

[56] References Cited

U.S. PATENT DOCUMENTS

| 3,178,658 | 4/1965 | Henrion | 331/113 R |
| 3,559,096 | 1/1971 | Lokerson | 331/113 R |
| 3,942,134 | 3/1976 | Schade, Jr. | 331/113 R |

Primary Examiner—John Zazworsky
Attorney, Agent, or Firm—Laurence J. Marhoefer; Lockwood D. Burton; Mitchell J. Halista

[57] ABSTRACT

A multivibrator circuit having a pair of capacitor cross-coupled transistors arranged to form a flip-flop circuit. The base and collector currents for the flipflop transistors are concurrently varied by respective current sources controlled by a multivibrator input signal. The circuit has a constant Beta requirement for the transistors over a wide frequency range while maintaining a high speed operation.

3 Claims, 2 Drawing Figures

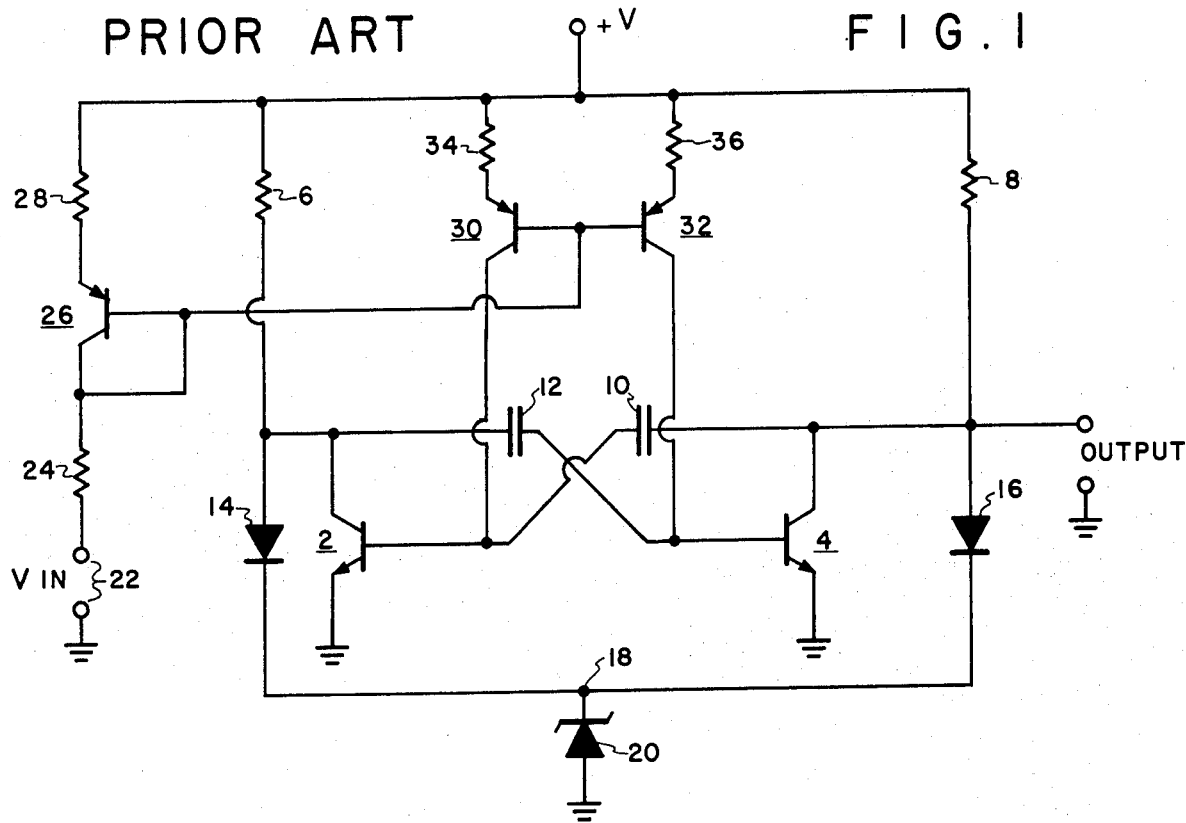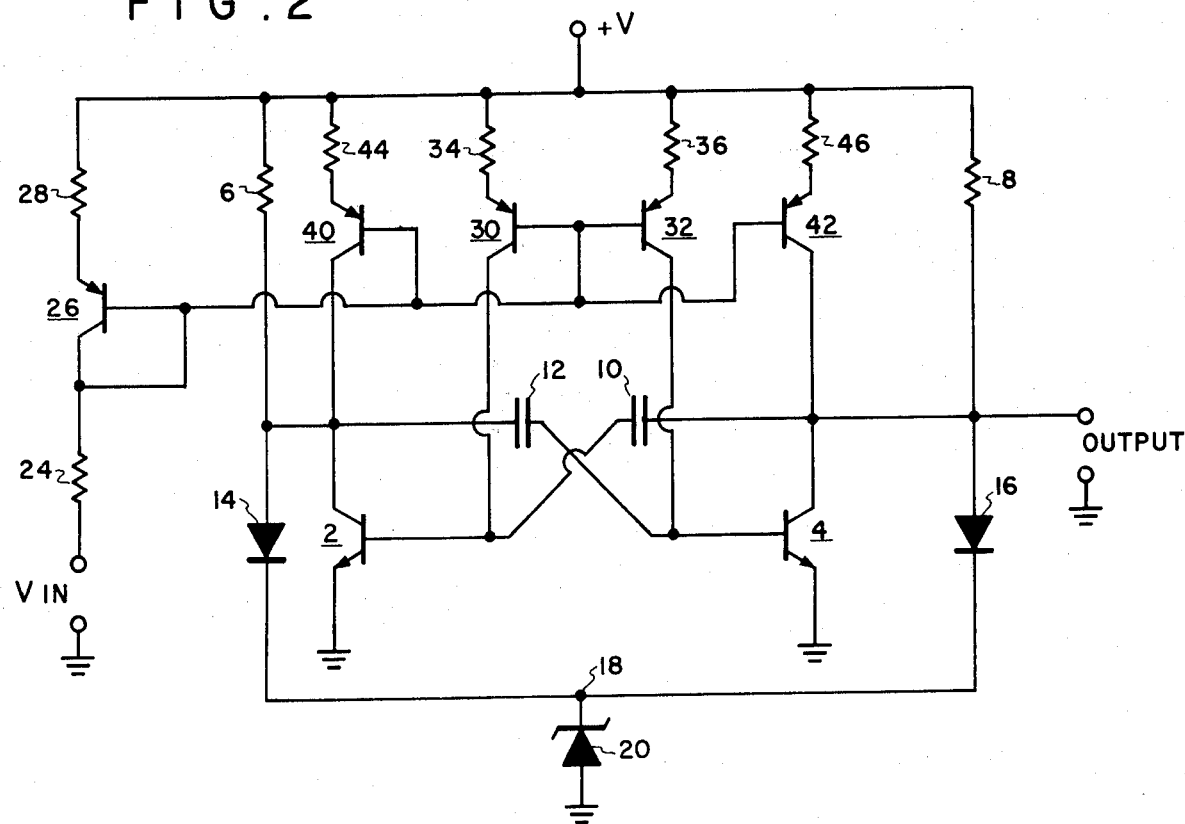

MULTIVIBRATOR CIRCUIT

BACKGROUND OF THE INVENTION

Field of the Invention

The present invention relates to multivibrator circuits. More specifically, the present invention is directed to a high frequency multivibrator circuit.

SUMMARY OF THE INVENTION

An object of the present invention is to provide an improved multivibrator circuit having a high maximum frequency of operation and wide range of operating frequency.

In accomplishing this and other objects, there has been provided, a multivibrator circuit having a pair of transistors cross-coupled to form a flip-flop circuit with respective base and collector current sources controlled by a common input signal.

DESCRIPTION OF THE DRAWINGS

A better understanding of the present invention may be had when the following detailed description is read in connection with the accompanying drawings, in which, FIG. 1 is a schematic illustration of a conventional multivibrator circuit and FIG. 2 is a schematic illustration of an example of a multivibrator circuit embodying the present invention.

DESCRIPTION OF THE PREFERRED EMBODIMENT

Detailed Description

Referring to FIG. 1 in more detail, there is shown a conventional multivibrator circuit having a pair of transistors 2, 4 connected in a conventional cross-coupled flip-flop circuit. Specifically, the emitters of the transistors 2, 4 are connected together by means of a common ground connection while the collectors are connected through respective resistors 6, 8 to a positive source +V. Concurrently, the base of the first transistor 2 is connected through a coupling capacitor 10 to the collector of the second transistor 4 and, similarly, the base of the second transistor 4 is connected through a capacitor 12 to the collector of the first transistor 2. A pair of diodes 14, 16 are arranged to connect respective ones of the collectors of the transistors 2, 4 to a common node 18 which, in turn, is connected to ground through a Zener diode 20. A pair of input terminals 22 are arranged to be connected to a source of an input signal $V_{In}$ and are connected to ground and to one end of an input resistor 24, respectively. The other end of the input resistor 24 is connected to the collector and base of an input transistor 26. The emitter of the input transistor 26 is connected through an emitter resistor 28 to the source +V. The base of the input transistor 26 is connected to the bases of a pair of current control transistors 30, 32. The collector of a first current control transistor 30 is connected to the base of the first flip-flop transistor 2 while the emitter of the first transistor 30 is connected through an emitter resistor 32 to the source =V. Similarly, the collector of the second current control transistor 32 is connected to the base of the second flip-flop transistor 4 and an emitter of the second transistor 32 is connected through an emitter resistor 36 to the source +V. In operation, as described more fully hereinafter, the flip-flop circuit shown in FIG. 1 is arranged to respond to an input signal applied to the input terminals 22 to interchange the conducting and non-conducting states of the flip-flop transistors 2, 4.

In FIG. 2, there is shown a schematic illustration of an example of a multivibrator circuit embodying the present invention. Similar reference numbers have been used in FIG. 2 to denote elements of the circuit common to FIG. 1. No further description of these elements is believed to be necessary inasmuch as they have been described above with reference to the operation of the circuit shown in FIG. 1. In addition, a pair of current control transistors 40, 42 and collector resistors 44, 46 have been added to provide the improved operation exhibited by the present invention. Specifically, a current control transistor 40 has a base electrode connected to the base electrode of the input transistor 6. The collector of the transistor 40 is connected to the collector of the first flip-flop transistor 2, and its emitter is connected through an emitter transistor 44 to the source +V. Similarly, a current control transistor 42 has its base electrode connected to the base electrode of the input transistor 26. The collector electrode of the transistor 42 is connected to the collector electrode of the second flip-flop transistor 4 while its emitter electrode is connected through an emitter resistor 46 to the source +V.

MODE OF OPERATION

In operation, the circuit shown in FIG. 1 is basically a voltage controlled oscillator. An input signal $V_{In}$ at the input terminals 22 drives a "current mirror" formed by the input transistor 26 and the switching control transistors 30, 32 together with the resistors 24, 28, 34 and 36. The outputs of the "current mirror" are equal currents from the collectors of the control transistors 30, 32. These currents are inversely proportional to the input voltage $V_{In}$. The flip-flop transistors 2, 4 alternately switch each other off and on as a result of the cross-coupling provided by the coupling capacitors 10, 12. The timing of the switching action is controlled by the discharging of the coupling capacitors 10, 12 by the current sources provided by the transistors 30, 32. For example, the discharging of coupling capacitor 12 by the current control transistor 32 creates a voltage ramp. When this voltage ramp reaches a threshold voltage of the base electrode of the flip-flop transistor 4, the flip-flop transistor 4 is turned "on" which, in turn, turns "off" the other flip-flop transistor 2 through the coupling capacitor 10. When the flip-flop transistor 2 is turned "off", the current flow through the resistor 6 recharges the coupling capacitor 12 unitl its voltage reaches the clamp voltage level determined by the diode 14 and the Zener diode 20.

When the capacitor 12 has charged to this level, the base current for the flip-flop transistor 4 is provided by the current control transistor 32. The collector current for the flip-flop transistor 4 is determined by the resistor 8. The charging time of capacitor 12 must be fast relative to the discharge time in order to create a square wave output at the collector of the flip-flop transistor 2. The operation of the other half of the flip-flop transistors switching which produces a turn-off of transistor 4 and turn-on of transistor 2 is symmetrical to that discussed above. This prior art circuit has a significant limitation in the range of frequencies over which the oscillator can be continuously controlled. This is due to the B (Beta) limitations of the flip-flop transistors 2, 4.

The requirement for a very high Beta is caused by the need to create a good square wave output whereby the charging time of the coupling capacitor must be fast relative to discharge time. Thus, the charging currents through the resistors 6, 8 must be at least five times higher than the discharge time currents. The currents through the current control transistors 30, 32 are the greatest when the voltage control oscillator circuit is operating at its highest frequencies. Thus, at a high frequency the minimum Beta which is allowable for the flip-flop transistors 2,4 is typically five. However, if the frequency of operation is lowered by a factor of twenty, the currents from the current control transistors 30, 32 will have also decreased by a factor of twenty which would, in turn, require the flip-flop transistors 2, 4 to have a minimum Beta of one hundred.

High frequency transistors normally have minimum Betas of about thirty. This is because high Betas are not very compatible with high switching speeds in the design of such transistors. Specially selected transistors which may have both high speed and a Beta near one hundred are very expensive, e.g., about ten times the cost of the normal high speed devices. Therefore, the prior art shown in FIG. 1 cannot be very fast, i.e., have a high frequency of operation, and also have a wide range of frequency adjustment while providing for an economical circuit product. Thus, in order to obtain the desired operation of the voltage controlled oscillator wherein an input pulse can, for example, vary in width by a factor of twenty to one the oscilator frequency must be continuously variable from 1 MHz to 20 MHz. The high speed and wide range of frequency are the two most important properties of the astable multivibrator circuit used in the voltage controlled oscillator.

In FIG. 2, there is shown an example of a voltage controlled oscillator circuit embodying the present invention wherein the above problem was solved, and the Beta limitation of the flip-flop transistors 2, 4 is overcome in order to provide a wide frequency range and high speed operation. The circuit shown in FIG. 2 includes the addition of the collector current source transistors 40, 42 and the collector resistors 44, 46. In addition, the resistance values of the resistors 6, 8 are significantly increased over the resistance values used in the conventional prior art circuit shown in FiG. 1. The transistors 40, 42 act as current sources which are controlled by the "current mirror" configuration in the same manner as the transistors 30, 32. Thus, the collector currents of the flip-flop transistors 2, 4 are varied in direct proportion to the base currents thereof. The change of base current for charging the coupling capacitors 10,12 is the variable which causes the change of frequency. The values of the emitter resistors 44, 46 are chosen to be one-fifth those of the resistors 34, 36. Thus, the output current from the current sources 40, 42 will always be five times the magnitude of the currents from the transistors 30, 32. Neglecting for the moment the effect of the resistors 6, 8, it may be seen that the Beta requirement for the flop-flop transistors 2, 4 is now constant and equal to five regardless of whether the multivibrator oscillator is operating at high frequency or a low frequency. Since a consideration of typical switching times versus collector currents for the transistors 2, 4 shows that if the collector currents become very low the switching times increase significantly, the resistors 6, 8 are arranged to provide minimum collector currents to eliminate this problem. The emitters of the switching transistors 2, 4 may be connected to additional logic circuits rather than simply to a ground connection whereby the logic circuits may be used to control the start of the operation of the oscillator circuit.

The following is a list of examples of circuit elements suitable for use in the circuit shown in FIG. 2:

| Transistors 2, 4 | 2N2369A |
| Transistors 26, 30, 32 | 2N3906 |
| Transistors 40, 42 | 2N2905 |
| Diodes 14, 16 | HP 2800 |
| Diode 20 | 1N5227B |
| Capacitors 10, 12 | 22 pF |
| Resistors 6, 8 | 3K |
| Resistor 24 | 7K |
| Resistor 28, 34, 36 | 1.0K |
| Resistors 44, 46 | 200 |

Accordingly, it may be seen that there has been provided, in accordance with the present invention, an improved mulivibrator circuit.

The embodiments of the invention in which an exclusive property or privilege is claimed are defined as follows:

1. A multivibrator circuit comprising
   an input circuit,
   a first switching transistor having a base electrode and a collector electrode,
   a second switching transistor having a base electrode and a collector electrode,
   cross-coupling means interconnecting said first and second transistors for forming a flip-flop circuit, said cross-coupling means including a first capacitor connecting said base electrode of said first transistor to said collector electrode of said second transistor and a second capacitor connecting said base electrode of said second transistor to said collector electrode of said first transistor,
   a first current source means for the base electrodes of said first and second transistors, said first current source means including a third transistor connected between said base electrode of said first transistor and an energizing source and a fourth transistor connected between said base electrode of said second transistor and the energizing source,
   a second current souce means for said collector electrodes of said first and second transistors and,
   energizing means connecting said input circuit to said first and second current source means for providing concurrent energization thereof.

2. A multivibrator circuit as set forth in claim 1 wherein said second current source means includes a fifth transistor connected between said collector electrodes of said first transistor and the energizing source and a sixth transistor connected between said collector electrode of said second transistor and the energizing source.

3. A multivibrator circuit as set forth in claim 2 wherein said energizing means connects said input circuit to a base electrode of said third, fourth, fifth and sixth transistors.

* * * * *